Jan. 17, 1967 J. T. RYAN 3,299,371

PLURAL TRANSISTOR LC OSCILLATOR CIRCUIT WITH SQUARE WAVE OUTPUT

Filed Aug. 23, 1965 2 Sheets-Sheet 1

INVENTOR
JOHN T. RYAN

BY Spencer E. Olson
ATTORNEY

Jan. 17, 1967 J. T. RYAN 3,299,371

PLURAL TRANSISTOR LC OSCILLATOR CIRCUIT WITH SQUARE WAVE OUTPUT

Filed Aug. 23, 1965 2 Sheets-Sheet 2

INVENTOR
JOHN T. RYAN

BY

ATTORNEY

United States Patent Office 3,299,371

Patented Jan. 17, 1967

3,299,371

PLURAL TRANSISTOR LC OSCILLATOR CIRCUIT WITH SQUARE WAVE OUTPUT

John T. Ryan, Hyde Park, Mass., assignor to Sylvania Electric Products Inc., a corporation of Delaware Filed Aug. 23, 1965, Ser. No. 481,792

9 Claims. (Cl. 331—114)

This invention relates generally to electronic circuits, and more particularly to improved square-wave power oscillator circuits.

The use of square-wave oscillators to provide either a sinusoidal or square-wave output derived from a D.C. supply voltage is well known in the art. Such oscillators are often used in conjunction with rectifiers in the output circuitry to raise or lower a D.C. supply voltage, and in this usage are known to be very efficient D.C.-to-D.C. converters. Many circuits are available to perform these functions, typical of which is the circuit shown in FIG. 2 of the article entitled "An Improved Square-Wave Oscillator Circuit" by James Lee Jensen published in volume IV of the September 1957 IRE Transactions on Circuit Theory, pages 276 to 279. The circuit described therein and modifications thereof have found wide application as an efficient means of converting a given D.C. voltage to a different D.C. output voltage, with the frequency of operation being determined by the hysteresis loop of the feedback transformer and the voltage applied to a given number of turns on the core. Such a circuit is particularly useful when a stable supply voltage is provided, and when used at a relatively low frequency of operation, that is, below 10 kilocycles per second.

However, it is known that such circuits are susceptible to variations in supply voltage; that is, if the supply voltage varies, the amplitude and frequency of the output voltage from the oscillator circuit will vary. Also, as indicated above, this circuit is seldom used at frequencies exceeding 10 kilocycles per second and is normally used at frequencies of the order of 1 kilocycle per second. It is often desirable to provide a stable output voltage at a fixed frequency, even though the supply voltage is susceptible to variations, and frequently advantageous to operate at frequencies far in excess of 10 kilocycles per second; e.g., as high as one megacycle per second. Desirably, such operating characteristics are provided using a minimum number of relatively inexpensive components to provide the requisite stability, especially where used in miniaturized systems.

Therefore, it is a general object of this invention to provide a square-wave oscillator the amplitude of the output voltage of which is relatively independent of the variations in the input supply voltage.

Another object of this invention is to provide a square-wave oscillator the output frequency of which is relatively independent of variations in the supply voltage.

Still another object of this invention is to provide a square-wave oscillator capable of providing output voltages having a frequency of the order of hundreds of kilocycles per second.

Yet another object of this invention is to provide a square-wave oscillator having the foregoing characteristics with relatively simple and inexpensive circuit components.

Briefly, the invention resides in the utilization of a tuned circuit in the feedback circuit of the oscillator. This inherently improves the operating frequency capability of the oscillator since the tuned tank cannot go into saturation, so is not thereby frequency limited. Therefore, the theoretical limitation on the upper frequency of such an oscillator is determined by the switching speed of the transistors used. Furthermore, through the use of this concept, the transformer portion of the tuned feedback circuit can be of simple and inexpensive construction; in fact, it can be an air core transformer for higher operating frequencies. With this feedback technique, the transistors of the oscillator are driven into saturation early in the operating cycle, thereby maintaining the overall efficiency of the oscillator. A further inherent advantage of this invention is that a variable frequency output is obtainable simply by tuning the feedback tank circuit to the desired frequency. For example, by placing a variable capacitor in the tuned tank the frequency of the output voltage can be varied over a wide frequency range, a feature which is not normally found in prior art square-wave power oscillator circuits.

These and other features and advantages of the invention will become more apparent from the following detailed description, taken in conjunction with the accompanying drawings, in which.

Figure 1:
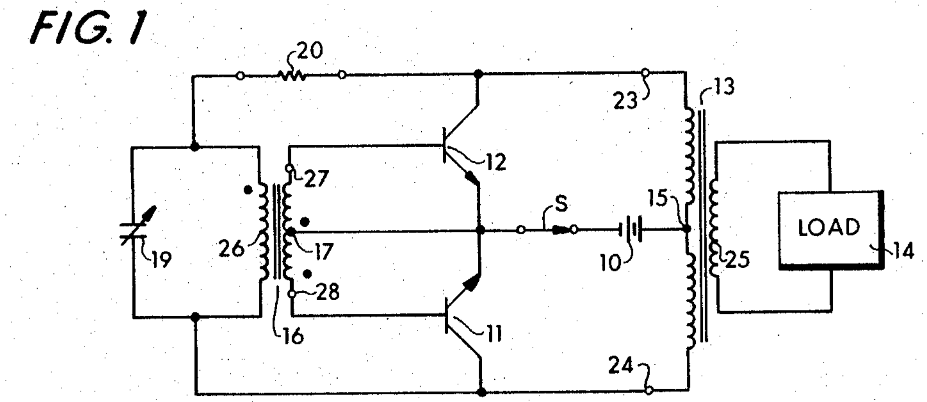
FIG. 1 is a schematic circuit representation of a square-wave oscillator circuit according to the invention.
Figure 1A:
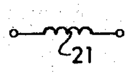
FIGS. 1A and 1B are schematic representations of alternate means for providing feedback to the tuned tank in the circuit of FIG. 1.
Figure 1B:
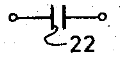

The basic oscillator circuit, shown schematically in FIG. 1, includes a source of D.C. potential, represented by battery 10, the negative terminal of which is connected via switch S to the emitter electrodes of a pair of transistors 11 and 12. The positive terminal of the battery is connected to the center tap 15 of the primary of a transformer 13, and the collector electrodes of transistors 11 and 12 are respectively directly connected to the terminals 24 and 23 of the primary winding of transformer 13. A load 14 is connected across the secondary winding 25 of transformer 13. Feedback is provided to a tuned tank consisting of the primary winding 26 of a transformer 16 connected in parallel with a capacitor 19, the resulting series-parallel connection being connected between the collector electrode of transistor 12 and the collector electrode of the transistor 11. The feedback circuit may consist simply of a resistor 20 as shown in FIG. 1, or alternatively may be a linear inductor 21, shown in FIG. 1A, or a capacitor 22, shown in FIG. 1B. The center tap 17 of the secondary winding of feedback transformer 16 is connected directly to the emitter electrodes of the transistors 11 and 12, and terminals 27 and 28 of the secondary winding respectively are directly connected to the base electrodes of transistors 12 and 11.

Briefly the operation of the circuit of FIG. 1 is as follows. Upon application of power from the D.C. source 10 by closing switch S, a transient is set up in the output transformer 13 causing a voltage immediately to be induced across one or the other of its primary windings. Assuming that initially this voltage is developed across winding having terminal 23, transistor 12 is rapidly driven into saturation, in turn causing a voltage to appear across the feedback loop through resistor 20 to the parallel resonant tank and initiating oscillations therein. These oscillations, in turn, induce a voltage through the transformer 16 to develop a voltage across the center-tapped secondary winding of the transformer in the sense shown by the dots on the transformer windings. When the voltage developed across the winding having terminal 27 is sufficiently negative, transistor 12 is cut off. Simultaneously, the voltage developed across winding having terminal 28 is increasingly positive driving transistor 11 into conduction, and soon thereafter into saturation. As a result, the voltage across the primary winding of transformer 13 is reversed with almost all of the supply voltage now appearing across the winding having terminal 24 of transformer 13, and a new cycle is started because the peak-to-peak voltage across the tank consisting of capacitor 19 and winding 26 of transformer 16 is now reversed. The cycle is continuously repeated at the frequency of the tuned tank. Since transistors 11 and 12 are alternately driven rapidly into saturation and into cutoff, the output voltage seen across the load 14 is a squarewave at the resonant frequency. The method of operation of this circuit is the same whether the resistor 20, the inductor 21 or the capacitor 22 is used in the feedback loop.

Figure 2:
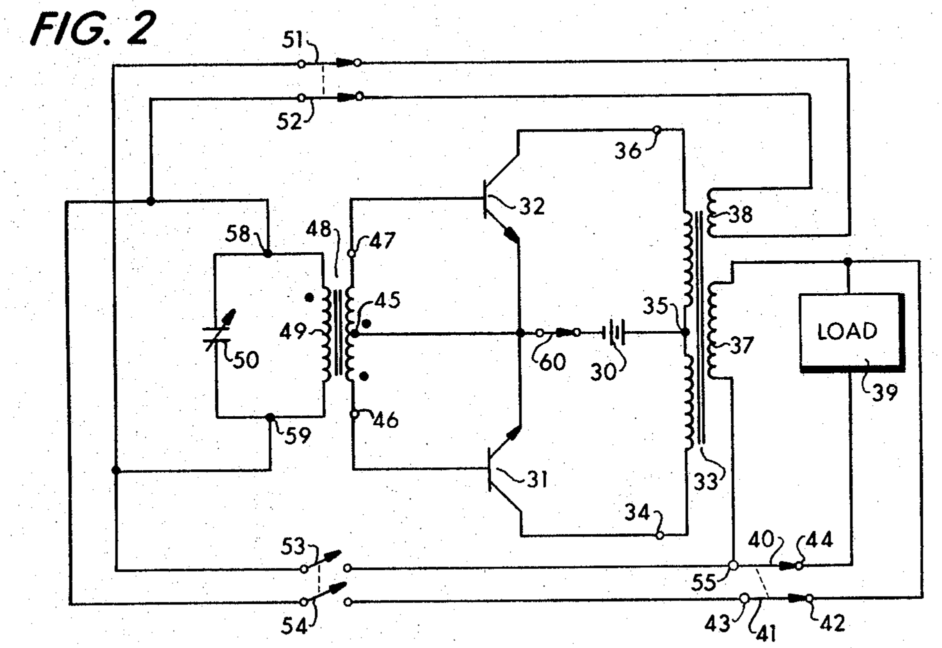
FIG. 2 is a schematic circuit diagram of a square-wave oscillator circuit according to the invention showing still other alternate means for providing feedback to the tuned tank circuit.

The circuit shown in schematic form in FIG. 2 is essentially the same as the circuit of FIG. 1 except that the circuit of FIG. 2 provides various modes of transformer coupled feedback. The D.C. source 30 is connected between the center tap 35 of the primary winding of a transformer 33 and the emitter electrodes of a pair of transistors 31 and 32 via a switch 60 with the opposite terminals 34 and 36 of the primary winding of the transformer 33 connected to the collector electrodes of the transistors 31 and 32, respectively. The secondary of transformer 33 consists of two windings 37 and 38, the winding 38 being connected between two terminals 58 and 59 by way of switches 52 and 51, and winding 37 being connected between two terminals 55 and 42. A load 39 is connected between terminals 42 and 44. A switch 53 is connected between terminals 59 and 55 and a second switch 54 is connected between terminals 58 and 43. A second transformer 48 has its primary winding 49 connected in parallel with a capacitor 50, the resulting parallel tank being connected between two terminals 58 and 59. The center tap 45 of the secondary winding of transformer 48 is connected directly to the emitter electrodes of transistors 31 and 32, with the opposite terminals 46 and 47 of the secondary winding connected directly to the base electrodes of transistors 31 and 32, respectively.

The operation of the circuit of FIG. 2 is the same as the previously described operation of the circuit of FIG. 1 except that feedback to excite the tuned tank is taken from the secondary of the output transformer 33. A first such connection to provided feedback to the tuned tank consists of closing switches 51 and 52, and opening switches 53 and 54 as illustrated, with switch 40 providing a direct connection between terminals 55 and 44, thereby placing the load across the secondary winding 37 of the output transformer 33. With this configuration, the secondary winding 38 of the output transformer 33 is connected in parallel with the tuned tank circuit, thereby providing the desired voltage feedback.

A second means for providing feedback to the tuned tank consists of opening switches 51 and 52, closing switches 53 and 54 and leaving switches 40 and 41 in their previously described positions, providing direct connections between terminals 55 and 44, and terminals 43 and 42, respectively. With the switches in these positions, the secondary winding 38 of transformer 33 is effectively removed from the circuit, and the secondary winding 37 of transformer 33, the load 39 and the tuned tank are connected in parallel, thereby providing an alternate means of voltage feedback to the tuned tank.

In some instances, such as when the load 39 is a relatively low impedance, it may be desired to provide current feedback from the output to the tuned tank. This is accomplished by leaving switches 51 and 52 open, and switches 53 and 54 closed, as previously described. Switches 40 and 41 are moved to an upward position such that switch 40 is open and switch 41 provides a direct connection between terminal 43 and 44, leaving terminal 42 open. In this configuration, the secondary winding 37 of transformer 33, the load 39 and the tuned tank are connected in series, thereby providing the desired current feedback.

Figure 3:
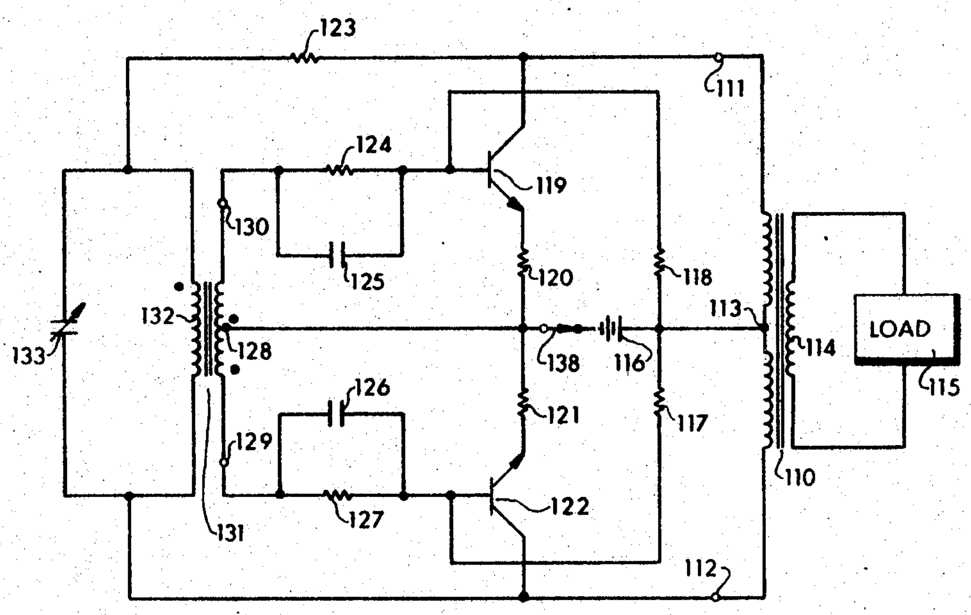
FIG. 3 is a schematic circuit diagram of a preferred embodiment of the invention.

The circuit of FIG. 3 illustrates a number of modifications which may be made to the basic circuit of FIG. 1. The primary reason for these modifications is to assure that the oscillator will start upon the application of the D.C. power to the circuit. Again, the secondary winding 114 of an output transformer 110 is connected across a load 115. The primary winding of an output transformer 110 is connected between terminals 111 and 112 with the center tap 113 of the winding connected to the positive terminal of a D.C. power source, represented by battery 116. The collector electrodes of two transistors 119 and 122 are respectively connected to terminals 111 and 112, and resistors 118 and 117 are connected between the respective base electrodes of transistors 119 and 122 and the positive terminal of the battery 116. Two resistors 120 and 121 are connected via a switch 138 between the negative terminal of the battery 116 and the emitter electrodes of the transistors 119 and 122, respectively. The secondary winding of a feedback transformer 131 is connected between terminals 129 and 130 with the center tap thereof connected through switch 138 to the negative terminal of the battery 116. A resistor 127 in parallel with a capacitor 126 is connected between terminal 129 and the base electrode of transistor 122. Similarly, a resistor 124 in parallel with a capacitor 125 is connected between terminal 130 and the base electrode of transistor 119.

The primary winding 132 of transformer 131 is connected in parallel with a capacitor 133 to form the tuned tank. A resistor 123 is connected between one end of the tank circuit and terminal 111 and the other end of the tank circuit is connected directly to terminal 112.

Resistors 118, 120 and 124 and 117, 121 and 127, together with battery 116 function to slightly forward bias transistors 119 and 122, respectively, when power is applied to the circuit thereby assuring that the circuit will start. Capacitors 125 and 126 are speed-up capacitors to provide more rapid saturation of transistors 119 and 122 during their respective conducting half cycles.

An operative embodiment of the circuit of FIG. 3, wherein transformer 110 had a turns ratio of 72:5 and transformer 131 had a turns ratio of 100:20, utilizing the following circuit components, provided an output voltage of 12.8 volts peak-to-peak at a freqcency of 100 k.c.:

| | | |
|---|---|---|
| Transistors **119**, **122** | | 2N1722 |
| Resistors **117**, **118** | ohms | 2K |
| Resistors **120**, **121** | do | 1 |
| Resistors **124**, **127** | do | 120 |
| Resistor **123** | do | 165 |
| Capacitors **125**, **126** | $\mu$fd | .05 |
| Capacitor **133** | $\mu\mu$fd | 30,000 |
| D.C. Power Source **116** | volts | +24 |

From the foregoing description, it is apparent that the invention provides a square-wave oscillator circuit having greatly increased frequency of operation capability. This is accomplished using inexpensive circuit components, yet provides improved output voltage and frequency stability. Since the transistors of the circuit as operated in saturation, as is the case in the prior art circuits, the efficiency of operation is equally as good, yet the circuit is much more versatile, since the frequency of the output voltage may be changed by varying the capacitance of the capacitor in the tuned tank circuit.

While illustrative embodiments of the invention have been shown and described, it will be obvious to those skilled in the art that numerous alterations may be incorporated without departing from the spirit of the invention. As previously indicated, there are many ways of providing feedback to the tuned tank circuit, only a few examples of which have been illustrated. It is also apparent that many means may be employed to assure the proper starting of the circuit, these being well known in the art. Further, though the invention has been illustrated as utilizing NPN transistors, PNP transistors may be employed by reversing the polarity of the D.C. power source. Therefore, it is intended that the invention not be limited to the specifics of the foregoing description but rather is to embrace the full scope of the following claims.

What is claimed is:

1. A square-wave power oscillator circuit comprising: first and second transistors, each having base, emitter and collector electrodes;
   a first transformer means including a center-tapped primary winding having first and second terminals connected to the collector electrodes of said transistors, and a secondary winding;
   a load connected across the secondary winding of said first transformer means;
   means connecting the emitter electrodes of said transistors to a point of reference potential;
   direct current means connected between the center tap of the primary winding of said first transformer means and point of reference potential for initiating conduction in one of said transistors;
   a second transformer means having a primary winding, and a center-tapped secondary winding connected between the base electrodes of said transistors, the center-tap being connected to said point of reference potential;
   a capacitor connected in parallel with the primary winding of said second transformer means to form therewith a parallel tuned tank means resonant at a frequency determined by said capacitor and primary winding; and
   means for coupling a feedback signal from said first transformer means directly to said tuned tank, means to initiate oscillations in said tank means whereby a voltage potential is induced in the secondary winding of said second transformer means, independent of load effects, of a polarity to render the initially conducting transistor non-conducting and the other of the transistors conducting and thereby introduce a square-wave signal to said load through said first transformer means.

2. The invention in accordance with claim 1, wherein said means for coupling a feedback signal from said first transformer means to said tuned tank means comprises:
   an impedance connected between one end of the primary winding of said first transformer means and one end of the primary winding of said second transformer means; and
   a direct connection between the other end of the primary winding of said first transformer means and the other end of the primary winding of said second transformer means.

3. The invention in accordance with claim 2, wherein said impedance comprises a resistor.

4. The invention in accordance with claim 2, wherein said impedance comprises a capacitor.

5. The invention in accordance with claim 2, wherein said impedance comprises an inductor.

6. The invention in accordance with claim 1, wherein said means for coupling a feedback signal from said first transformer means to said tuned tank means comprises a second secondary winding on said first transformer means having its ends connected to the respective ends of the primary winding of said second transformer means.

7. The invention in accordance with claim 1, wherein said load is connected across the secondary winding of said first transformer means and said means for coupling a feedback signal from said first transformer means to said tuned tank means comprises first and second direct connections from the opposite ends of the secondary winding of said first transformer means to the opposite ends of the primary winding of said second transformer means, respectively.

8. The invention in accordance with claim 1, wherein said means for coupling a feedback signal from said first transformer means to said tuned tank means comprises:
   means connecting said load between one end of the secondary winding of said first transformer means and one end of the primary winding of said second transformer means; and
   means directly connecting the other end of the secondary winding of said first transformer means to the other end of the primary winding of said second transformer means.

9. The invention in accordance with claim 1, additionally comprising first and second resistors connected between the center tap on the primary winding of said first transformer means and the base electrodes of said first and second transistors, respectively.

References Cited by the Examiner

UNITED STATES PATENTS

| | | | |
|---|---|---|---|
| 2,883,539 | 4/1959 | Bruck et al. | 331—114 |
| 2,949,583 | 8/1960 | Sargeant | 331—114 |
| 2,965,856 | 12/1960 | Roesel | 331—113 |
| 2,971,126 | 2/1961 | Schultz | 331—113 |
| 3,026,486 | 3/1962 | Pintell | 331—113 |
| 3,097,345 | 7/1963 | Ingram | 331—117 |

OTHER REFERENCES

Finch: Ost "Transistor Power Supply," May 1960, page 83, 331–113.

ROY LAKE, *Primary Examiner.*

J. KOMINSKI, *Assistant Examiner.*